US012245514B2

(12) United States Patent
Saito et al.

(10) Patent No.: US 12,245,514 B2
(45) Date of Patent: Mar. 4, 2025

(54) VIBRATION DEVICE AND ELECTRONIC APPARATUS

(71) Applicant: TDK CORPORATION, Tokyo (JP)

(72) Inventors: Kazuki Saito, Tokyo (JP); Kaoru Kijima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 787 days.

(21) Appl. No.: 17/604,463

(22) PCT Filed: May 12, 2020

(86) PCT No.: PCT/JP2020/018979
§ 371 (c)(1),
(2) Date: Oct. 18, 2021

(87) PCT Pub. No.: WO2020/230787
PCT Pub. Date: Nov. 19, 2020

(65) Prior Publication Data
US 2022/0212230 A1 Jul. 7, 2022

(30) Foreign Application Priority Data
May 13, 2019 (JP) .................................. 2019-090578

(51) Int. Cl.
*H10N 30/87* (2023.01)
*B06B 1/06* (2006.01)
*G06F 3/01* (2006.01)

(52) U.S. Cl.
CPC ......... *H10N 30/875* (2023.02); *B06B 1/0662* (2013.01); *B06B 1/0651* (2013.01); *G06F 3/016* (2013.01)

(58) Field of Classification Search
CPC ... B06B 1/0662; B06B 1/0651; B06B 1/0666; G06F 3/016; G06F 3/0202; G06F 3/03547
See application file for complete search history.

(56) References Cited

U.S. PATENT DOCUMENTS 9,544,694 B2* 1/2017 Abe ................... H10N 30/875
2016/0276300 A1* 9/2016 Matsuo ................. H01L 24/05
(Continued)

FOREIGN PATENT DOCUMENTS

| JP | 2019041217 A | * | 3/2019 | ............ H01L 41/09 |
| KR | 102138325 B1 | * | 7/2020 | ............ H10N 30/88 |
| WO | 2013/167683 A1 | | 11/2013 | |

OTHER PUBLICATIONS

Nov. 16, 2021 International Preliminary Report on Patentability issued in International Patent Application No. PCT/JP2020/018979.

*Primary Examiner* — J. San Martin
(74) *Attorney, Agent, or Firm* — Oliff PLC

(57) ABSTRACT

A vibration device includes a vibration plate, a piezoelectric element, and a wiring member. The vibration plate has conductivity. The piezoelectric element is disposed on the vibration plate. The wiring member is disposed to oppose the vibration plate via the piezoelectric element. The piezoelectric element includes a piezoelectric element body, a first external electrode, and a second external electrode. The piezoelectric element body has a first main surface and a second main surface facing away from each other in an opposing direction of the vibration plate and the wiring member. The first external electrode is disposed on the first main surface and electrically connected to the vibration plate. The second external electrode is disposed on the second main surface and electrically connected to the wiring member. The vibration plate includes a first projection projecting toward the wiring member and electrically connected to the wiring member.

8 Claims, 5 Drawing Sheets

(56) References Cited

U.S. PATENT DOCUMENTS

2020/0282426 A1\* 9/2020 Ohta ........................ H03H 9/17
2021/0060612 A1\* 3/2021 Saito ...................... H04R 17/00

\* cited by examiner

VIBRATION DEVICE AND ELECTRONIC APPARATUS

TECHNICAL FIELD

The present disclosure relates to a vibration device and an electronic apparatus.

BACKGROUND ART

Known vibration devices include vibration plates and piezoelectric elements disposed on the vibration plates (for example, Patent Literature 1). Patent Literature 1 discloses a piezoelectric device including a disk and a sheet of piezoelectric material disposed on the disk. The piezoelectric device functions as a touch sensor, and detects pressing by a user's finger by bending vibration of the sheet of piezoelectric material. The piezoelectric device also functions as a tactile feedback element to impart a bending vibration to the sheet of piezoelectric material, thereby imparting a tactile vibration to the user's finger.

CITATION LIST

Patent Literature

Patent Literature 1: WO2013/167683

SUMMARY OF INVENTION

Technical Problem

In the vibration device as described above, a wiring member may be disposed on the piezoelectric element, the wiring member may be electrically connected to an upper electrode of the piezoelectric element, and the wiring member may be electrically connected to a lower electrode of the piezoelectric element through the vibration plate. In this case, since there is a height difference between the vibration plate and the upper electrode, each of which is connected to the wiring member, the electrical connection of the wiring member may not be stable.

The present disclosure provides a vibration device and an electronic apparatus capable of stabilizing an electrical connection of a wiring member.

Solution to Problem

A vibration device according to an aspect of the present disclosure includes a vibration plate, a piezoelectric element, and a wiring member. The vibration plate has conductivity. The piezoelectric element is disposed on the vibration plate. The wiring member is disposed to oppose the vibration plate via the piezoelectric element. The piezoelectric element includes a piezoelectric element body, a first external electrode, and a second external electrode. The piezoelectric element body has a first main surface and a second main surface facing away from each other in an opposing direction of the vibration plate and the wiring member. The first external electrode is disposed on the first main surface and electrically connected to the vibration plate. The second external electrode is disposed on the second main surface and electrically connected to the wiring member. The vibration plate includes a first projection projecting toward the wiring member and electrically connected to the wiring member.

In the vibration device, the vibration plate includes a first projection, and the first projection projects toward the wiring member and is electrically connected to the wiring member. Therefore, a height difference between the vibration plate and the second external electrode of the piezoelectric element can be reduced as compared with the case where the vibration plate does not include the first projection. Therefore, the electrical connection of the wiring member can be stabilized.

The vibration plate may include a second projection projecting toward the wiring member to support the wiring member. In this case, the wiring member is supported by the second projection and stabilizes its posture. Therefore, the electrical connection of the wiring member can be further stabilized.

The vibration plate may have a third main surface opposing the piezoelectric element. The third main surface may include an opposing region opposing the piezoelectric element. A height of the first projection may be equal to a height of the second external electrode when a virtual plane including the opposing region is set as a reference surface. In this case, the electrical connection of the wiring member can be further stabilized.

A tip portion of the first projection may be a curved surface that is convex toward the wiring member. In this case, the connection strength between the first projection and the wiring member may be improved compared to a case where the tip portion of the first projection is pointed.

The wiring member may be adhered to the first projection by an adhesive. The adhesive may cover a side surface of the first projection. In this case, a connection between the first projection and the wiring member may be reinforced by the adhesive.

The first projection may be formed by bending the vibration plate. In this case, it is possible to suppress an increase in electrical resistance compared to a case where a separate member is attached to the vibration plate to configure the first projection.

A length of the first projection may be shorter than a distance between the first projection and the piezoelectric element when viewed from the opposing direction. In this case, a short circuit between the first projection and the piezoelectric element can be suppressed.

An electronic apparatus according to an aspect of the present disclosure includes the vibration device.

Since the electronic apparatus includes the vibration device, the electrical connection of the wiring member can be stabilized.

Advantageous Effects of Invention

According to an aspect of the present disclosure, a vibration device and an electronic apparatus capable of stabilizing electrical connection of a wiring member are provided.

DESCRIPTION OF EMBODIMENTS

Figure 1:
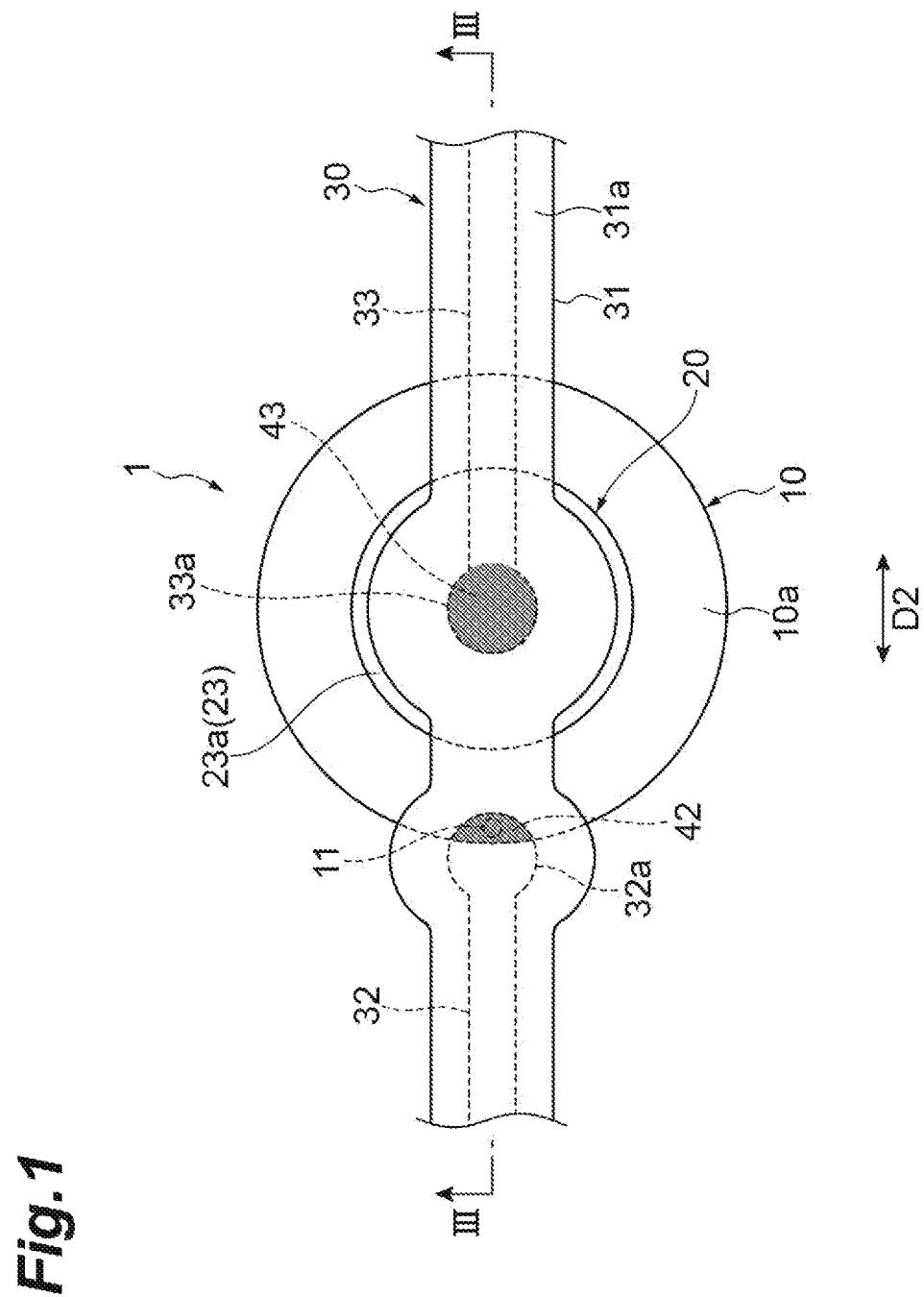
FIG. 1 is a top view showing a vibration device according to a first embodiment.

Hereinafter, embodiments will be described in detail with reference to the accompanying drawings. In the description, the same reference numerals are used for the same elements or elements having the same functions with redundant description omitted.

First Embodiment

Figure 2:
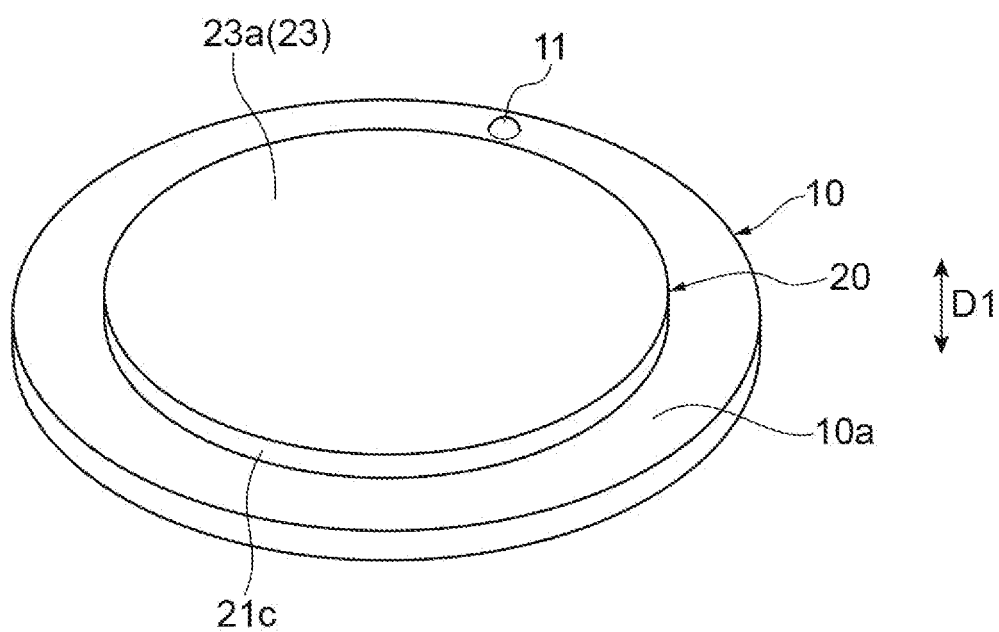
FIG. 2 is a perspective view showing the piezoelectric element and the vibration plate in FIG. 1.
Figure 3:
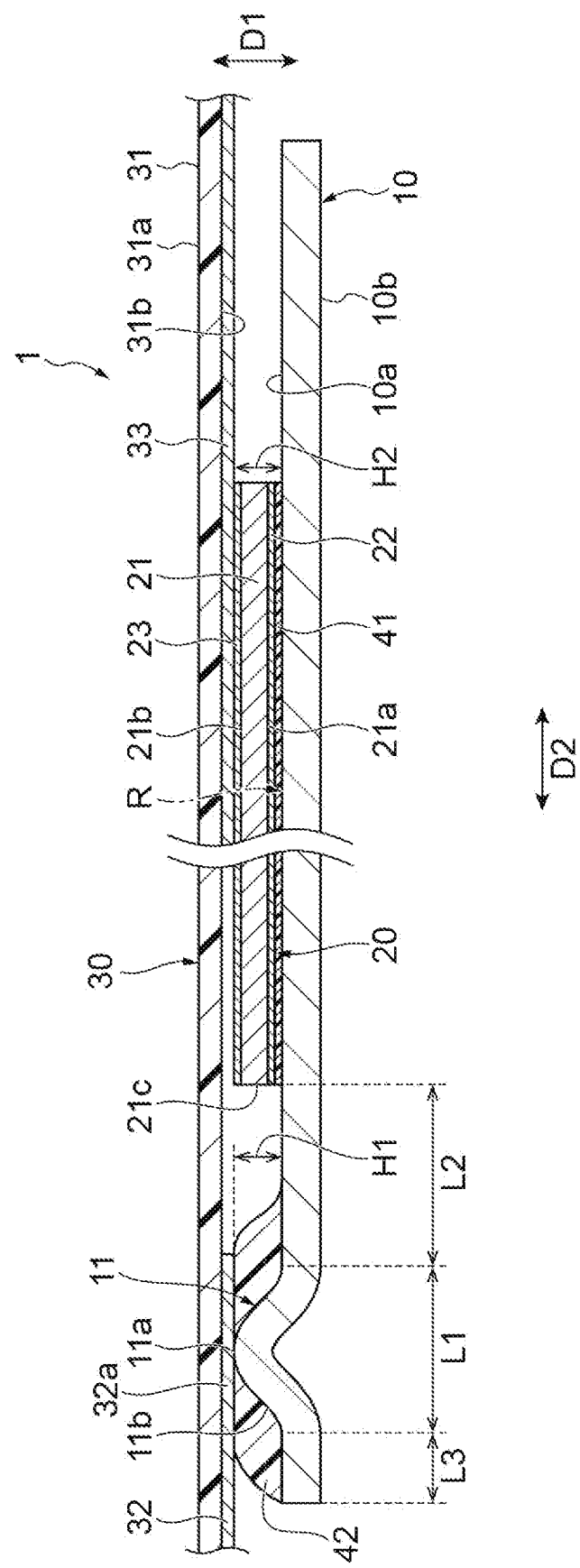
FIG. 3 is a cross-sectional view taken along line III-III in FIG. 1.

FIG. 1 is a top view showing a vibration device according to a first embodiment. FIG. 2 is a perspective view showing the piezoelectric element and the vibration plate in FIG. 1. FIG. 3 is a cross-sectional view taken along line III-III in FIG. 1. As shown in FIGS. 1 to 3, the vibration device 1 according to the first embodiment includes a vibration plate 10, a piezoelectric element 20, and a wiring member 30. The piezoelectric element 20 is disposed on the vibration plate 10. The wiring member 30 is disposed to oppose the vibration plate 10 via the piezoelectric element 20. The piezoelectric element 20 is disposed between the vibration plate 10 and the wiring member 30. Hereinafter, an opposing direction between the vibration plate 10 and the wiring member 30 is referred to as a first direction D1.

The vibration plate 10 is a plate member for amplifying the vibration of the piezoelectric element 20. The vibration plate 10 has conductivity. The vibration plate 10 is made of, for example, metal. The vibration plate 10 is made of, for example, a Ni—Fe alloy, Ni, brass, or stainless steel.

The vibration plate 10 has main surfaces 10a and 10b facing away from each other. An opposing direction of the main surfaces 10a and 10b coincides with the first direction D1. The first direction D1 is also a direction orthogonal to the main surfaces 10a and 10b. The thickness of the vibration plate 10 (the length of the vibration plate 10 in the first direction D1) is, for example, 50 μm or more and 300 μm or less. In the embodiment, the thickness of the vibration plate 10 is, for example, 120 μm.

The shape and area of the main surface 10a are substantially the same as those of the main surface 10b. When viewed from the first direction D1, the outer edge of main surface 10a substantially coincides with the outer edge of main surface 10b. The main surfaces 10a and 10b have, for example, a circular shape. In the embodiment, the main surfaces 10a and 10b have a perfect circular shape. The diameters of the main surfaces 10a and 10b are, for example, 8 mm or more and 30 mm or less. In the embodiment, the diameters of the main surfaces 10a and 10b are, for example, 15 mm.

The main surface 10a opposes the piezoelectric element 20 in the first direction D1. The main surface 10a has an opposing region R opposing the piezoelectric element 20 in the first direction D1. The opposing region R is a region overlapping the piezoelectric element 20 when viewed from the first direction D1. When viewed from the first direction D1, the outer edge of the opposing region R coincides with the outer edge of the piezoelectric element 20. In the embodiment, the opposing region R has a circular shape.

The vibration plate 10 includes a projection 11 projecting toward the wiring member 30. The projection 11 is a portion projecting toward the wiring member 30 from a reference surface described later. The projection 11 has, for example, a conical shape. The projection 11 is tapered toward a tip portion 11a of the projection 11. The projection 11 has, for example, a circular shape when viewed from the first direction D1. In the embodiment, the projection 11 has a perfect circular shape when viewed from the first direction D1. The length L1 of the projection 11 when viewed from the first direction D1 is, for example, 0.05 mm or more and 0.25 mm or less. In the embodiment, the length L1 is a diameter of the projection 11 when viewed from the first direction D1, and is, for example, 0.12 mm.

The projection 11 is provided apart from the piezoelectric element 20 when viewed from the first direction D1. When viewed from the first direction D1, the distance (shortest distance) L2 between the outer edge of the projection 11 and the piezoelectric element 20 is, for example, 1 mm or more and 2 mm or less. In the embodiment, the distance L2 is, for example, 1.5 mm. When viewed from the first direction D1, the length L1 of the projection 11 is shorter than the distance L2. When viewed from the first direction D1, a distance (shortest distance) L3 between the projection 11 and the outer edge of the main surface 10a of the vibration plate 10 is, for example, not less than 0.1 mm and not more than 1 mm. In the embodiment, the distance L3 is, for example, 0.4 mm.

When viewed from the first direction D1, the projection 11 may have a shape other than a circular shape. In this case, the length L1 may be defined as a length in which a straight line connecting the outer edge of the projection 11 and the piezoelectric element 20 at the shortest distance overlaps the projection 11 when viewed from the first direction D1. The length L1 may be defined as a maximum length of a straight line connecting two points on the outer edge of the projection 11 when viewed from the first direction D1.

When a virtual plane including the opposing region R is set as a reference surface, a height H1 of the projection 11 (the distance of the projection 11 in the first direction D1) is, for example, 50 μm or more and 250 μm or less. In the embodiment, the height H1 is, for example, 140 μm.

The surface of the projection 11 is constituted by a part of the main surface 10a. The tip portion 11a is a curved surface that is convex toward the wiring member 30. In the embodiment, the projection 11 is formed by bending the vibration plate 10. That is, in the projection 11, the main surfaces 10a and 10b are curved while being kept substantially parallel to each other. In projection 11, it can be said that main surface 10a projects and main surface 10b is recessed. The projection 11 is formed by embossing the vibration plate 10, for example. Specifically, the projection 11 is formed by pressing the vibration plate 10 from the main surface 10b side with a punch to plastically deform the vibration plate 10.

The piezoelectric element 20 includes a piezoelectric element body 21, an external electrode 22, and an external electrode 23. The piezoelectric element body 21 has a plate shape. The piezoelectric element body 21 has, for example, main surfaces 21a and 21b and a side surface 21c. The main surfaces 21a and 21b face away from each other. The opposing direction of the main surfaces 21a and 21b coincides with the first direction D1. The first direction D1 is also a direction orthogonal to the main surfaces 21a and 21b.

Main surface 21a opposes main surface 10a in first direction D1. The main surface 21b opposes the wiring member 30 in the first direction D1. The side surface 21c extends in first direction D1 in such a way as to connect main surface 21a and main surface 21b. The main surfaces 21a and 21b and the side surface 21c are indirectly adjacent to each other via ridge portions. The thickness of the piezoelectric element body 21 (the length of the piezoelectric element body 21 in the first direction D1) is, for example, 40 µm or more and 300 µm or less. In the embodiment, the thickness of the piezoelectric element body 21 is, for example, 140 µm.

The shape and area of the main surface 21a are substantially the same as those of the main surface 21b. When viewed from the first direction D1, the outer edge of main surface 21a substantially coincides with the outer edge of main surface 21b. The main surfaces 21a and 21b have, for example, circular shapes. In the embodiment, the main surfaces 21a and 21b have perfect circular shapes. The diameters of the main surfaces 21a and 21b are, for example, 5 mm or more and 20 mm or less. In the embodiment, the diameters of the main surfaces 21a and 21b are, for example, 10 mm.

The piezoelectric element body 21 is made of a piezoelectric material. In the embodiment, the piezoelectric element body 21 is made of a piezoelectric ceramic material. The piezoelectric ceramic material may be, for example, PZT [Pb (Zr, Ti) O3], PT (PbTiO$_3$), PLZT [(Pb, La) (Zr, Ti)O$_3$] or barium titanate (BaTiO$_3$). The piezoelectric element body 21 is formed of, for example, a sintered body of a ceramic green sheet containing the above-described piezoelectric ceramic material.

The external electrode 22 is disposed on the main surface 21a. The external electrode 23 is disposed on the main surface 21b. In the embodiment, the external electrode 22 covers the entire main surface 21a. The external electrode 23 covers the entire main surface 21b. The external electrodes 22 and 23 have circular shapes when viewed from the first direction D1. In the embodiment, the external electrodes 22 and 23 have perfect circular shapes.

The external electrodes 22 and 23 are made of conductive material. As the conductive material, for example, Ag, Pd, or an Ag—Pd alloy is used. The external electrodes 22 and 23 are formed as sintered bodies of a conductive paste containing the conductive material. In the embodiment, the piezoelectric element 20 does not include internal electrodes disposed inside the piezoelectric element body 21.

The thicknesses of the external electrodes 22 and 23 (the lengths of the external electrodes 22 and 23 in the first direction D1) are, for example, 3 µm or more and 20 µm or less. In the embodiment, the thicknesses of the external electrodes 22 and 23 are, for example, 7 µm, which are equivalent to each other. When a virtual plane including the opposing region R of the vibration plate 10 is defined as a reference plane, the height H2 of the external electrode 23 (a surface of the external electrode 23 close to the wiring member 30) is equal to the height H1 of the projection 11.

The piezoelectric element 20 is adhered to the vibration plate 10. The piezoelectric element 20 and the vibration plate 10 are connected via an adhesive 41. The piezoelectric element 20 is connected to the vibration plate 10 so that the external electrode 22 opposes the main surface 10a of the vibration plate 10. That is, the external electrode 22 and the main surface 10a of the vibration plate 10 oppose each other via the adhesive 41.

The adhesive 41 is made of a conductive resin. Therefore, the external electrode 22 is electrically connected to the vibration plate 10 through the adhesive 41. The conductive resin includes a resin (for example, thermosetting resin) and a conductive material (for example, metal powder). As the metal powder, for example, Ag powder is used. As the thermosetting resin, for example, a phenol resin, an acrylic resin, a silicone resin, an epoxy resin, or a polyimide resin is used.

The piezoelectric element 20 is located substantially at the center of the main surface 10a when viewed from the first direction D1. The substantial center of the main surface 10a includes not only the center position of the main surface 10a but also positions away from the center position of the main surface 10a due to manufacturing errors or tolerances. The substantial center of the main surface 10a also includes positions away from the center of the main surface 10a by a predetermined minute length. The predetermined length is, for example, 8% of the radius of the main surface 10a.

When viewed from the first direction D1, the area of the piezoelectric element 20 is smaller than the area of the vibration plate 10. When viewed from the first direction D1, the outer edge of the piezoelectric element 20 is located inside the outer edge of the vibration plate 10. When viewed from the first direction D1, the distance (minimum distance) between the outer edge of the piezoelectric element 20 and the outer edge of the vibration plate 10 is, for example, 1 mm or more and 5 mm or less.

The wiring member 30 includes a base 31, a conductive layer 32, and a conductive layer 33. The base 31 has, for example, a band shape and extends in a direction intersecting the first direction D1. Hereinafter, the direction in which the base 31 extends is referred to as a second direction D2. The base 31 has main surfaces 31a and 31b facing away from each other. The opposing direction of the main surfaces 31a and 31b coincides with the first direction D1. The wiring member 30 is disposed such that the main surface 31b opposes the vibration plate 10 and the piezoelectric element 20. The base 31 is electrically insulating. The base 31 is, for example, a resin layer made of resin such as polyimide resin.

The thickness of the base 31 is, for example, 100 µm. The width of the base 31 (the length of the base 31 in a direction orthogonal to the first direction D1 and the second direction D2), for example, in the portions where the one end portions 32a and 33a of the conductive layers 32 and 33 and are provided is greater than those in the other portions. The maximum width of the base 31 is shorter than the diameter of the piezoelectric element 20 (the diameters of the main surfaces 21a and 21b). Therefore, when viewed from the first direction D1, a portion of the piezoelectric element 20 and a portion of the vibration plate 10 are exposed from the wiring member 30. The width of the base 31 is, for example, 10 mm or more and 35 mm or less. In the embodiment, the maximum value of the width of the base 31 is, for example, 20 mm, and the minimum value is, for example, 10 mm.

The conductive layers 32 and 33 are disposed on the main surface 31b of the base 31. The conductive layers 32 and 33 are adhered to main surface 31b by an adhesive layer (not shown). The conductive layers 32 and 33 are made of, for example, Cu. The conductive layers 32 and 33 may have a configuration in which a Ni plating layer and an Au plating layer are provided in this order on a Cu layer, for example. The thicknesses of the conductive layers 32 and 33 are, for example, 20 µm. As long as the base 31 has the main surface 31b on which the conductive layers 32 and 33 are disposed, the shape thereof is not limited to the band shape.

The conductive layers 32 and 33 extend along the second direction D2. The one end portion 32a of the conductive layer 32 and the one end portion 33a of the conductive layer 33 are separated from each other in the second direction D2. The one end portions 32a and 33a have, for example, circular shapes when viewed from the first direction D1. The base 31 is formed in a circular shape along the outer edges of the one end portions 32a and 33a at the portions where the one end portions 32a and 33a are disposed. The other end (not shown) of the conductive layer 32 and the other end (not shown) of the conductive layer 33 are connected to a control unit (not shown) described later.

The one end portion 32a is disposed on the projection 11 of the vibration plate 10. The one end portion 32a overlaps the entire projection 11 when viewed from the first direction D1. The one end portion 32a is adhered to the tip portion 11a of the projection 11 by an adhesive 42. The one end portion 32a and the tip portion 11a are connected via the adhesive 42. The wiring member 30 is connected to the vibration plate 10 such that one end portion 32a opposes the tip portion 11a. That is, the one end portion 32a and the tip portion 11a oppose each other via the adhesive 42. The adhesive 42 entirely covers the side surface 11b of the projection 11. As indicated by gray hatching in FIG. 1, the adhesive 42 is disposed in a region where the one end portion 32a and the vibration plate 10 overlap each other when viewed from the first direction D1 in the one end portion 32a and the vibration plate 10.

The one end portion 33a of the conductive layer 33 is disposed on the external electrode 23. The one end portion 33a overlaps substantially the center of the external electrode 23 when viewed from the first direction D1. The substantial center of the external electrode 23 includes not only the center position of the external electrode 23 but also positions away from the center position of the external electrode 23 due to manufacturing errors or tolerances. The substantial center of the external electrode 23 also includes a position away from the center of the external electrode 23 by a predetermined minute length. The predetermined length is, for example, 8% of the radius of the external electrode 23. The one end portion 33a is adhered to the external electrode 23. The one end portion 33a and the external electrode 23 are connected via an adhesive 43 (see FIG. 5). That is, the one end portion 33a and the external electrode 23 oppose each other via the adhesive 43. As shown by gray hatching in FIG. 1, the adhesive 43 is disposed between the entire one end portion 33a and the vibration plate 10.

The adhesives 42 and 43 are made of conductive resin. Accordingly, the projection 11 is electrically connected to the conductive layer 32 of the wiring member 30 through the adhesive 42. As described above, since the external electrode 22 is electrically connected to the vibration plate 10 through the adhesive 41, the external electrode 22 is electrically connected to the conductive layer 32 of the wiring member 30 through the adhesive 41, 42. The external electrode 23 is electrically connected to the conductive layer 33 of the wiring member 30 through the adhesive 43. The adhesives 42 and 43 may be made of, for example, the same material as the adhesive 41 or may be made of different material.

The control unit is electrically connected to the piezoelectric element 20 by the wiring member 30, and generally controls the vibration device 1. The control unit includes, for example, a CPU (central processing unit), a ROM (read only memory), and a RAM (random access memory). In this case, the control unit loads a program stored in the ROM into the RAM and executes the program by the CPU to perform various processes.

For example, the vibration device 1 is used in such a manner that the outer edge portion of the vibration plate 10 is supported by a supporter and the piezoelectric element 20 can bend together with the vibration plate 10. For example, a touch panel may be disposed on the wiring member 30. When the fingertip of the user using the vibration device 1 contacts the touch panel and the piezoelectric element 20 is bent, the piezoelectric element 20 provides a detection signal to the controller. Upon receiving the detection signal, the control unit supplies a drive signal to the piezoelectric element 20 to drive the piezoelectric element 20. The piezoelectric element 20 vibrates based on the drive signal.

Specifically, the controller applies AC voltages having different polarities to the external electrodes 22 and 23 through the conductive layers 32 and 33 of the wiring member 30 as the driving signal. As a result, an electric field is generated between the external electrode 22 and the external electrode 23. A region sandwiched between the external electrode 22 and the external electrode 23 in the piezoelectric element body 21 becomes an active region, and displacement occurs in the active region. The piezoelectric element 20 repeats expansion and contraction according to the frequency of the AC voltage.

Since the vibration plate 10 and the piezoelectric element 20 are bonded to each other, the vibration plate 10 performs bending vibration integrally with the piezoelectric element 20 in response to repeated expansion and contraction of the piezoelectric element 20. As a result, it is possible to provide a tactile sensation to the user. The tactile sensation is, for example, a click sensation. The click sensation is, for example, a pressing sensation or a touch sensation obtained when the push button switch is pressed. In the vibration device 1, since the vibration from the piezoelectric element 20 and the vibration from the vibration plate 10 are transmitted to the wiring member 30 in such a way as to be shifted from each other, the vibration has a wide range.

As described above, in the vibration device 1, the vibration plate 10 includes the projection 11, and the projection 11 projects toward the wiring member 30 and is electrically connected to the wiring member 30. Therefore, the height difference between the vibration plate 10 and the external electrode 23 can be reduced as compared with the case where the vibration plate 10 does not include the projection 11. Therefore, the electrical connection of the wiring member 30 can be stabilized. In the vibration device 1, the height H1 of the projection 11 is equal to the height H2 of the external electrode 23 when a virtual plane including the opposing region R is set as a reference surface. Therefore, the electrical connection of the wiring member 30 can be further stabilized.

The tip portion 11a of the projection 11 is a curved surface that is convex toward the wiring member 30. Therefore, for example, the connection strength between the wiring member 30 and the vibration plate 10 can be improved compared to a case where the tip portion 11a of the projection 11 is pointed.

The wiring member 30 is adhered to the projection 11 by an adhesive 42, and the adhesive 42 covers the side surface 11b of the projection 11. Therefore, the connection between the projection 11 and the wiring member 30 can be reinforced by the adhesive 42.

The projection 11 is formed by bending the vibration plate 10. That is, since the vibration plate 10 and the projection 11 are formed of one member, it is possible to suppress an increase in electric resistance as compared with a case where another member other than the vibration plate is attached to the vibration plate to configure the projection. In addition, the projection 11 is not easily detached from the vibration plate 10. That is, a reliability defect (e.g., separation) due to another member can be suppressed.

When viewed from the first direction D1, the length L1 of the projection 11 is shorter than the distance L2 between the projection 11 and the piezoelectric element 20. Since the distance L2 is long, a short circuit between the projection 11 and the piezoelectric element 20 can be suppressed.

Since the projection 11 exists, the vibration is transmitted to the user's finger not only from the piezoelectric element 20 but also from the projection 11. Therefore, the tactile sensation can be stably provided to the user.

Second Embodiment

Figure 4:
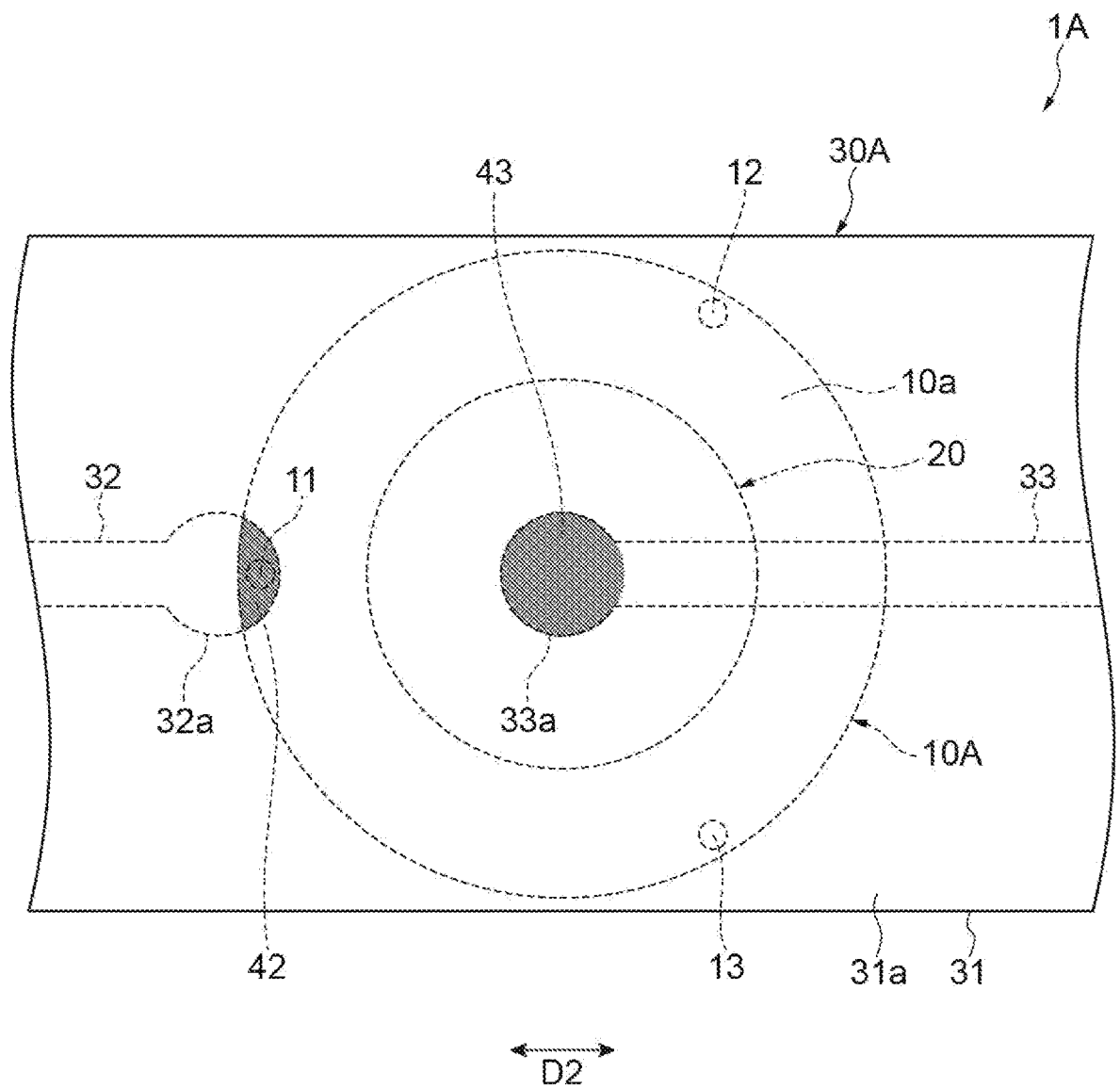
FIG. 4 is a top view showing a vibration device according to a second embodiment.

FIG. 4 is a top view showing a vibration device according to a second embodiment. As shown in FIGS. 1 and 4, the vibration device 1A according to the second embodiment is different from the vibration device 1 in that a vibration plate 10A and a wiring member 30A are provided instead of the vibration plate 10 and the wiring member 30.

The vibration plate 10A is different from the vibration plate 10 in that it further includes projections 12 and 13. The projections 12 and 13 project toward the wiring member 30A and support the wiring member 30. The projections 12 and 13 are disposed apart from the conductive layers 32 and 33 of the wiring member 30 and are connected to the base 31. The projections 12 and 13 may or may not be adhered to the base 31 by an adhesive (not shown). As the adhesive in this case, a resin not containing a conductive material can be used.

The projections 12 and 13 have, for example, the same shapes as the projection 11. The heights of the projections 12 and 13 are, for example, equal to the height H1 of the projection 11 when a virtual plane including the opposing region R of the vibration plate 10 is set as a reference surface. The heights of the projections 12 and 13 may be higher than the height H1 of the projection 11 by the thicknesses of the conductive layers 32 and 33, for example. The projections 11, 12 and 13 are separated from each other. The projections 11, 12 and 13 are, for example, arranged at equal intervals around the piezoelectric element 20 so as to surround the piezoelectric element 20 when viewed from the first direction D1.

The wiring member 30A is different from the wiring member 30 in that the width of the base 31 is greater than the diameter of the vibration plate 10 (the diameter of the main surface 10a). When viewed from the first direction D1, the piezoelectric element 20 and the vibration plate 10A are disposed so as not to be exposed from the wiring member 30A. In the embodiment, the base 31 has a constant width.

Also in the vibration device 1A, since the vibration plate 10A includes the projection 11, the same effect as that of the vibration device 1 can be obtained. In the vibration device 1A, the vibration plate 10A further includes projections 12 and 13, and the projections 12 and 13 support the wiring member 30A. Therefore, the posture of the wiring member 30A is stabilized. If the posture of the wiring member 30A is inclined, the distance between the projection 11 and the wiring member 30A is increased, and the electrical connection of the wiring member 30A may not be stable. In contrast, in the vibration device 1A, since the wiring member 30A is supported by the projections 12 and 13 and stabilizes its posture, the electrical connection of the wiring member 30A can be further stabilized.

Third Embodiment

Figure 5:
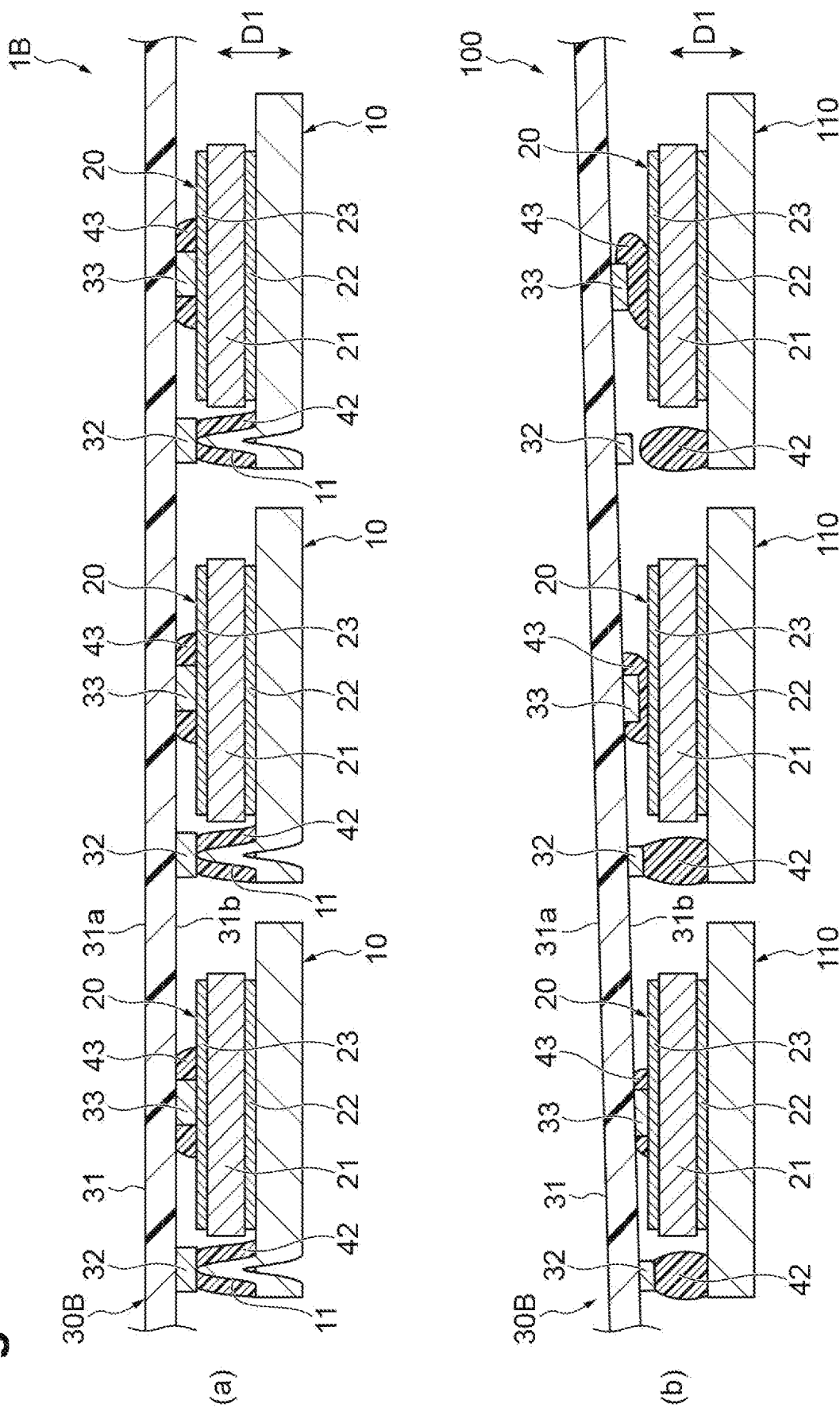
FIG. 5(a) is a cross-sectional view showing the vibration device according to a third embodiment.
FIG. 5(b) is a cross-sectional view showing a vibration device according to a comparative example.

FIG. 5($a$) is a cross-sectional view showing the vibration device according to a third embodiment, and FIG. 5($b$) is a cross-sectional view showing a vibration device according to a comparative example. As shown in FIG. 5($a$), the vibration device 1B according to the third embodiment is different from the vibration device 1 (see FIG. 1) in that a plurality of vibration plates 10 and a plurality of piezoelectric elements 20 are provided and a wiring member 30B is provided instead of the wiring member 30.

The wiring member 30B includes a plurality of conductive layers 32 and a plurality of conductive layers 33. The plurality of conductive layers 32 and the plurality of conductive layers 33 are disposed on the main surface 31$b$ of the single base 31. In the vibration device 1B, each piezoelectric element 20 is disposed on each vibration plate 10. Each set of the vibration plate 10 and the piezoelectric element 20 is connected to the corresponding conductive layers 32 and 33. A plurality of sets of the vibration plate 10 and the piezoelectric element 20 are arranged apart from each other.

As shown in FIG. 5($a$) and FIG. 5($b$), a vibration device 100 according to the comparative example is different from the vibration device 1B in that a plurality of vibration plates 110 are provided instead of the plurality of vibration plates 10. The vibration plate 110 does not include the projection 11. Therefore, there is a height difference between the vibration plate 110 and the external electrode 23, each of which is connected to the wiring member 30B. The amount of the adhesive 42 connecting the vibration plate 110 and the conductive layer 32 of the wiring member 30 needs to be appropriately set according to the height difference. If the amount of adhesive 42 varies, the posture of the wiring member 30B may be inclined as shown in FIG. 5($b$). Accordingly, the connection between the vibration plate 110 and the wiring member 30B is more likely to be unstable. In addition, when the user's finger presses the touch panel, it is difficult to uniformly apply the pressing force to each piezoelectric element 20.

In contrast, in the vibration device 1B, since each vibration plate 10 includes the projection 11, the height difference between each vibration plate 10 and the external electrode 23 of each piezoelectric element 20 can be reduced. Therefore, the variation in the amount of the adhesive 42 hardly affects the posture of the wiring member 30B. Therefore, the electrical connection between the wiring member 30B and each vibration plate 10 can be stabilized. In addition, when the user's finger presses the touch panel, the pressing force is likely to be uniformly applied to each piezoelectric element 20. Further, the tactile sensation provided to the user is stabilized.

The present invention is not necessarily limited to the above-described embodiments and modifications, and can be variously changed without departing from the scope of the invention.

For example, in the projections 11, 12 and 13, the main surfaces 10$a$ of the vibration plates 10 and 10A may protrude and the main surfaces 10$b$ may be flat surfaces. The projections 11, 12 and 13 may be formed by attaching another member other than the vibration plates 10 and 10A to the vibration plates 10 and 10A. The vibration plates 10 and 10A may include one of the projections 12 and 13, and may further include a projection for supporting the wiring member 30 in addition to the projections 12 and 13. The projections 11, 12 and 13 may have not only conical shapes but also triangular pyramid shapes, pyramid shapes, or pillar shapes.

When viewed from the first direction D1, the vibration plates 10 and 10A may have not only circular shapes but also rectangular shapes, for example. When viewed from the first direction D1, the piezoelectric element 20 may have not only a circular shape but also a rectangular shape, for example. The vibration device 1B may include a vibration plate 10A. In the vibration devices 1 and 1A, the piezoelectric element 20 may be in a bent state in which the main surface 21$a$ is on the outside of the curve and the main surface 21$b$ is on the inside of the curve. In this case, the displacement amount of the piezoelectric element 20 can be increased (obtained) by the bending amount. At this time, since the vibration plates 10 and 10A is bent in such a way that the main surface 10b is on the outer side of the curve and the main surface 10a is on the inside of the curve in correspondence with the piezoelectric element 20, the wiring members 30 and 30A and the projection 11 can be easily connected even when the height H1 is lower than the height H2.

REFERENCE SIGNS LIST 1, 1A, 1B: vibration device, 10, 10A: vibration plate, 10a: main surface (third main surface), 11: projection (first projection), 11a: tip portion, 11b: side surface, 12, 13: projection (second projection), 20: piezoelectric element, 21: piezoelectric element body, 21a: main surface (first main surface), 21b: main surface (second main surface), 22: external electrode (first external electrode), 23: external electrode (second external electrode), 30, 30A, 30B: wiring member, 42: adhesive, D1: first direction (opposing direction), R: opposing region.

The invention claimed is:

1. A vibration device comprising:
a vibration plate having conductivity;
a piezoelectric element disposed on the vibration plate; and
a wiring member disposed to oppose the vibration plate via the piezoelectric element,
wherein the piezoelectric element includes:
a piezoelectric element body having a first main surface and a second main surface facing away from each other in an opposing direction of the vibration plate and the wiring member;
a first external electrode disposed on the first main surface and electrically connected to the vibration plate;
a second external electrode disposed on the second main surface and electrically connected to the wiring member,
wherein the vibration plate includes a first projection projecting toward the wiring member and electrically connected to the wiring member.

2. The vibration device according to claim 1, wherein the vibration plate includes a second projection projecting toward the wiring member to support the wiring member.

3. The vibration device according to claim 1, wherein the vibration plate has an upper main surface opposing the piezoelectric element,
the upper main surface includes an opposing region opposing the piezoelectric element, and
a height of the first projection in the opposing direction measured from the opposing region is equal to a height of the second external electrode in the opposing direction measured from the opposing region.

4. The vibration device according to claim 1, wherein a tip portion of the first projection is a curved surface that is convex toward the wiring member.

5. The vibration device according to claim 1, wherein the wiring member is adhered to the first projection by an adhesive, and
the adhesive covers a side surface of the first projection.

6. The vibration device according to claim 1, wherein the first projection is formed by bending the vibration plate.

7. The vibration device according to claim 1, wherein a length of the first projection is shorter than a distance between the first projection and the piezoelectric element when viewed from the opposing direction.

8. An electronic apparatus comprising the vibration device according to claim 1.

* * * * *